United States Patent [19]

Akita

[11] 4,025,914
[45] May 24, 1977

[54] DIGITAL SIGNAL GENERATOR

[75] Inventor: Shigeyuki Akita, Okazaki, Japan

[73] Assignee: Nippon Soken, Inc., Nishio, Japan

[22] Filed: Aug. 2, 1974

[21] Appl. No.: 494,314

[30] Foreign Application Priority Data

Aug. 7, 1973 Japan .................... 48-88976

[52] U.S. Cl. ..................... 340/204; 340/347 P
[51] Int. Cl.$^2$ ........................ G08C 19/16
[58] Field of Search ............ 340/204, 354, 347 P

[56] References Cited

UNITED STATES PATENTS

| | | | |
|---|---|---|---|
| 2,132,213 | 10/1938 | Locke | 340/204 |
| 2,880,410 | 3/1959 | Postman | 340/204 |
| 3,015,814 | 1/1962 | Lippel | 340/347 P |
| 3,032,752 | 5/1962 | Welch | 340/204 |
| 3,056,956 | 10/1962 | Retzinger | 340/204 |
| 3,138,794 | 6/1964 | Blum | 340/204 |
| 3,187,318 | 6/1965 | Chapman | 340/204 |
| 3,558,861 | 1/1971 | Collins | 340/347 P |

FOREIGN PATENTS OR APPLICATIONS 738,001  10/1955  United Kingdom ............... 340/204

Primary Examiner—Thomas B. Habecker
Attorney, Agent, or Firm—Cushman, Darby & Cushman

[57] ABSTRACT

There is provided a digital signal generator for producing accurate digital signals according to the detected state of a combination consisting of mechanical and electrical elements. The generator has a signal section consisting of a predetermined conductor pattern including a digital signal pattern and a timing signal pattern and a contact group slidable over the signal section to take out digital signal and timing signal. A digital signal is selectively provided in correspondence to the relative position of the signal section relative to the contact group, and the accuracy of the digital signal is ensured by so arranging that it is provided with the timing signal prevails at a timing signal contact in the aforesaid contact group.

6 Claims, 6 Drawing Figures

DIGITAL SIGNAL GENERATOR

BRIEF SUMMARY OF THE INVENTION

This invention relates to a digital signal generator for producing an accurate digital signal according to the detected state of a combination consisting of mechanical and electrical elements, and its object is to provide a digital signal generator, which comprises a signal section consisting of a predetermined conductor pattern including a digital signal pattern and a timing signal pattern and a contact group slidable over the signal section to take out the digital signal and the timing signal, and in which a digital signal is selectively taken out from a digital signal generator circuit in correspondence to the relative position of the signal section relative to the contact group when a timing signal is provided.

BRIEF DESCRIPTION OF THE DRAWINGS

The accompanying drawings illustrate one embodiment of the digital signal generator according to the invention, and in which.

DESCRIPTION OF THE PREFERRED EMBODIMENT

The invention will now be described in conjunction with an embodiment thereof with reference to the drawings.

Figure 1:
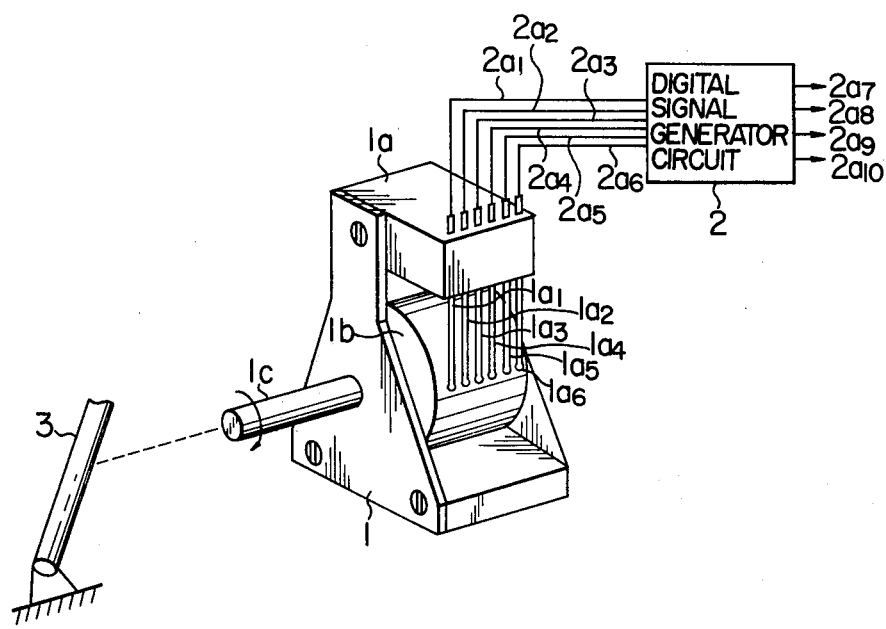
FIG. 1 is a schemative representation of the entire system.

FIG. 1 shows an outline of a digital signal generator which is adapted to produce a digital signal according to the throttle position of a vehicle. Reference numeral 1 generally disignates a detector comprising a cylindrical drum $1b$ serving as signal section and provided on the periphery with a predetermined conductor pattern including a digital signal pattern and a timing signal pattern and a contact group $1a$ consisting of 6 contacts $1a_1$ to $1a_6$ in slidable contact with the signal section. A digital signal can be taken out from the contact group $1a$ in accordance with the position of the signal section relative to the contact group. The cylindrical drum $1b$ is integral with a rotative shaft $1c$ serving as drive means, and the position of the drum relative to the contact group is shifted with the rotation of the rotative shaft $1c$. Numeral 2 designates a digital signal generator circuit having input terminals $2a_1$ to $2a_6$ and output terminals $2a_7$ to $2a_{10}$. Signals from the contact group $1a$ are led to the input terminals $2a_1$ to $2a_7$, and a digital signal coupled from the digital signal contacts $1a_1$, $1a_2$, $1a_4$ and $1a_5$ to the input terminals $2a_1$, $2a_2$, $2a_4$ and $2a_5$ and corresponding to the afore-mentioned relative position appears at the output terminals $2a_7$ to $2a_{10}$ at an instant of appearance of a timing signal from the timing contact $1a_3$ at the input terminal $2a_3$. The rotative shaft $1c$ is rotated by depressing an accelerator pedal 3, and its position is determined by the position of the acelerator pedal. The conductor pattern provided on the periphery of the drum $1b$ is arranged such that one of 16 different 4-bit digital signals may be taken out from the output terminals $2a_7$ to $2a_{10}$ according to the relative position of the drum $1b$, that is, the position of the accelerator pedal 3.

Figure 2:
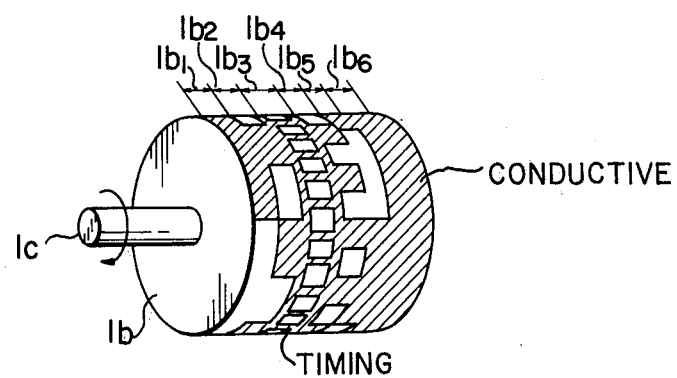
FIG. 2 is a perspective view of the signal section.

FIG. 2 shows in detail the conductor pattern printed on the periphery of the drum $1b$. It consists of 6 parallel or axial divisions $1b_1$ to $1b_6$ to provide for digital signals, timing signal and a common signal. The divisions $1b_1$, $1b_2$, $1b_4$ and $1b_5$ have their respective conductor patterns for respective $2^3$, $2^1$, $2^0$ and $2^2$ portions of a digital signal. The division $1b_3$ is provided for a timing signal, and the division $1b_6$ is provided for a common signal. These conductor pattern divisions $1b_1$ to $1b_6$ are in contact with the respective contacts $1a_1$ to $1a_6$ in the contact group $1a$ shown in FIG. 1, and which contacts are connected to the respective input terminals $2a_1$ to $2a_5$ of the digital signal generator circuit 2 by means of six conductive wires.

Figure 3:
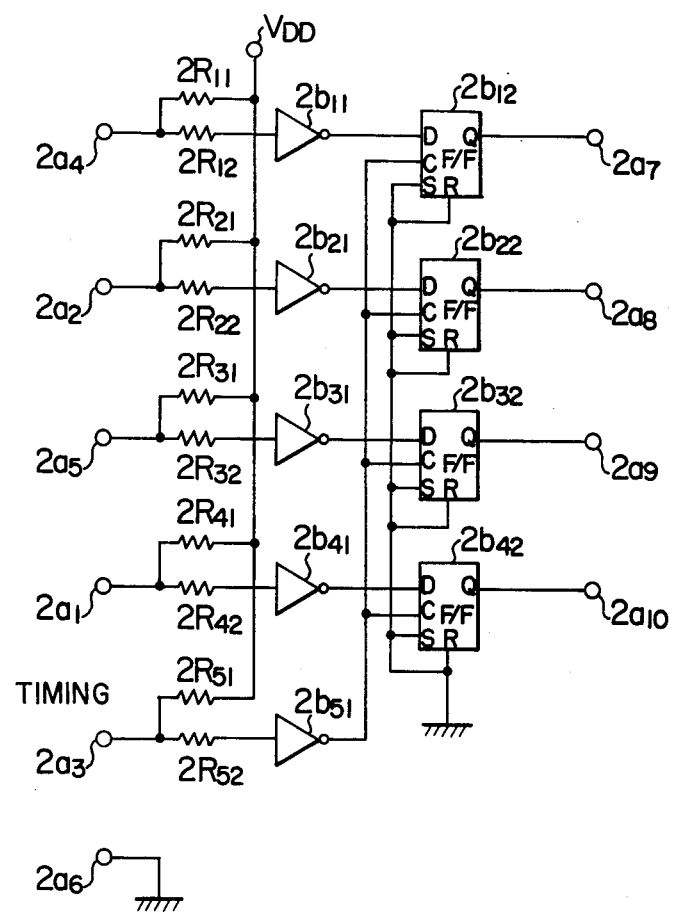
FIG. 3 is an electric connection diagram of the digital signal generator circuit.

FIG. 3 shows the circuit diagram of the digital signal generator circuit. In FIG. 3, the input terminal $2a_6$ is grounded. Indicated at $V_{DD}$ is a positive bias terminal connected to the positive side of a power supply. $2^0$, $2^1$, $2^2$ and $2^3$ signals are led to the respective input terminals $2a_4$, $2a_2$, $2a_5$ and $2a_1$, and timing signal is led to the input terminal $2a_3$. Designated at $2R_{11}$, $2R_{12}$, $2R_{21}$, $2R_{22}$, $2R_{31}$, $2R_{32}$, $2R_{41}$, $2R_{42}$, $2R_{51}$ and $2R_{52}$ are resistors, designated at $2b_{11}$, $2b_{21}$, $2b_{31}$, $2b_{41}$ and $2b_{51}$ are inverters, and designated at $2b_{12}$, $2b_{22}$, $2b_{32}$ and $2b_{42}$ are D type flip-flops which may be "MOS IC CD4013" (a trade name by Radio Corporation of America in U.S.A.). In each of the flip-flops $2b_{12}$–$2b_{42}$, the terminal symbol D designates data, C clock, S set, R reset, and Q output. As is known in the art, D type flip-flops are clockable bistable storage elements which change the output state thereof only when a separate pulse, i.e., clock pulse, is coupled thereto.

The operation of the above construction will now be described in connection with FIG. 4, which is a developed view of the drum $1b$. Since the input terminal $2a_6$ is grounded, all the shaded portions of the conductor pattern represent level "0". That is, the shaded portions in the conductor pattern shown in FIG. 2 or the conductive pattern in FIG. 4 which shows a developed view of the pattern in FIG. 2 represent level 0. As the accelerator pedal 3 is depressed the drum $1b$ is rotated in unison with the rotative shaft $1c$ relative to the contact group $1a$. When the drum $1b$ comes to a position at which the contacts $1a_1$ to $1a_6$ are on line 31 in FIG. 4, the $2^0$ signal at the input terminal $2a_4$ is of level 1 due to the resistor $2R_{11}$, and a signal of level 0 is coupled through the inverter $2b_{11}$ to the data terminal D of the D type flip-flop $2b_{12}$. Similarly, the $2^1$ signal at the input terminal $2a_2$ is of level 1 due to the resistor $2R_{21}$, and a signal of level 0 is coupled through the inverter $2b_{21}$ to the data terminal D of the D type flip-flop $2b_{22}$. On the other hand, the $2^2$ signal at the input terminal $2a_5$ and the $2^3$ signal at the input terminal $2a_1$ are of level 0, and a signal of level 1 is coupled through the inverters $2b_{31}$ and $2b_{41}$ to the respective data terminals D of the D type flip-flops $2b_{32}$ and $2b_{42}$. Meanwhile, the timing signal at the input terminal $2a_3$ is of level 0, and a signal of level 1 is coupled through the inverter $2b_{51}$ to the clock terminals c of the individual D type flip-flops $2b_{12}$, $2b_{22}$, $2b_{32}$ and $2b_{42}$, so that the signal at the data terminal D of each flip-flop appears at the output terminal Q. Thus, the outputs at the output terminals $2a_7$ and $2a_8$ respectively representing the $2^0$ signal and $2^1$ signal are of level 0, while the $2^2$ signal and $2^3$ signal appearing at the respective output terminals $2a_9$ and $2a_{10}$ are of level 1. In this way, the extent of depression of the accelerator pedal 3, that is, the throttle aperture, can be represented by a 4-bit digital signal.

Figure 4:
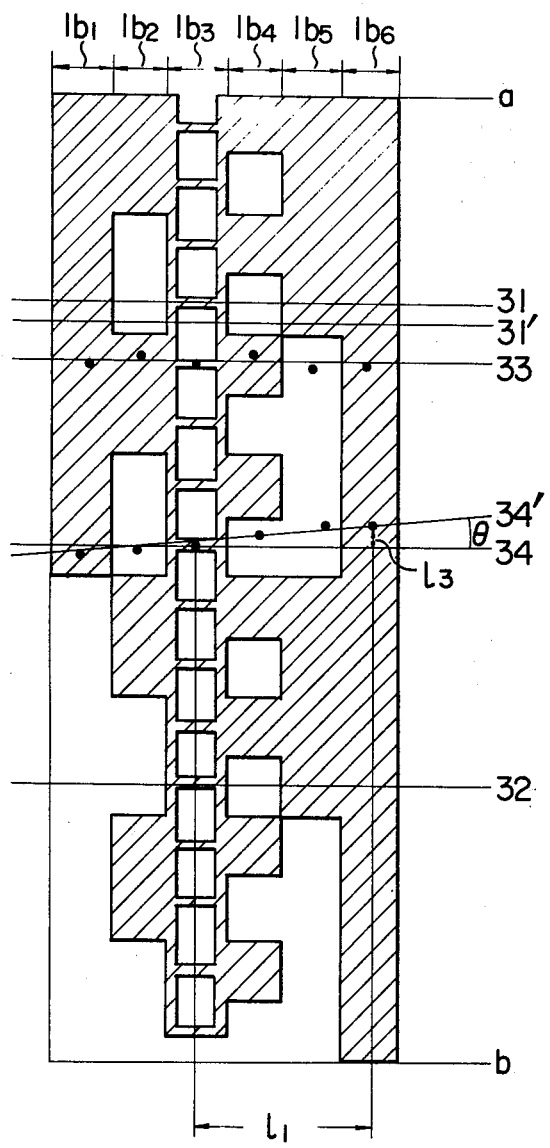
FIG. 4 is a developed view of the signal section.

When the drum $1b$ is further rotated with further depression of the accelerator pedal 3 to a position at which the contacts $1a_1$ to $1a_6$ are on line $31'$ in FIG. 4, the signal at the input terminal $2a_3$ is of level 1, and the signal coupled through the inverter $2b_{51}$ to the clock terminals $c$ of the D type flip-flops $2b_{12}$, $2b_{22}$, $2b_{32}$ and $2b_{42}$ is of level 0. Thus, the previous digital signal at the output terminals $2a_7$ to $2a_{10}$ is maintained.

When the drum $1b$ is still further rotated with the continued depression of the accelerator pedal 3 to a position at which the contacts $1a_1$ to $1a_6$ are on line 33 in FIG. 4, the level of the timing signal at the input terminal $2a_3$ rises again to level 1, so that at this time signals of level 1, 1, 0 and 1 at the data terminals D of the respective flip-flops $2b_{12}$, $2b_{22}$, $2b_{32}$ and $2b_{42}$ appear in that state at the respective output terminals $2a_7$ to $2a_{10}$ as 4-bit digital signal.

Figure 5A:
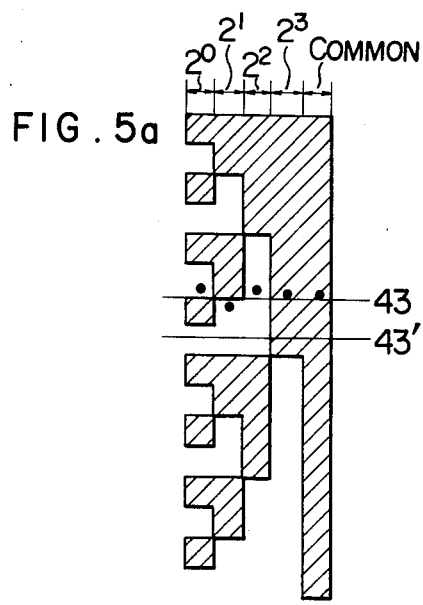
FIGS. 5a and 5b are pattern views given to illustrate features of the system according to the invention.

Now, the effect of providing the conductor pattern division for the timing signal at the center of the overall pattern as in FIG. 4 will be discussed. For the sake of comparison, a conductor pattern without division for the timing signal is shown in FIG. 5a. In manufacture, it is very difficult to perfectly align the tips of a plurality of contacts in contact with the pattern, and usually these tips are out of alignment as shown by dots in FIG. 5a. In this case, when the drum comes to a position at which the contacts are intended to be on line 43 in FIG. 5a, the $2^0$ signal is of level 1, the $2^1$ signal is of level 1, the $2^2$ signal is of level 1, and the $2^3$ signal is of level 0. This results in malfunctioning since this state is the same as that in which the contact tips are on line $43'$ in FIG. 5a. By the provision of the conductor pattern division $1b_3$ for the timing signal as shown in FIG. 4, the malfunctioning that might otherwise result due to out-of-alignment of the contact tips with respect to, for instance, line 33 in FIG. 4, can be prevented by taking out the digital signal only when the timing signal is of level 0.

Figure 5B:
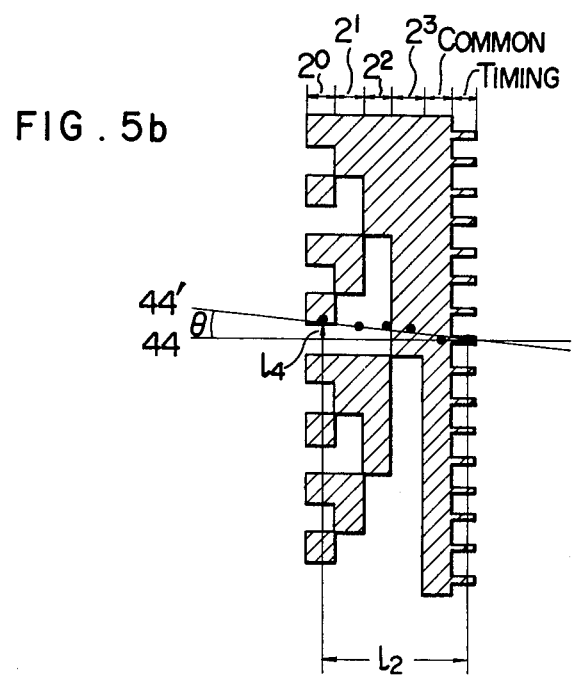

In the above embodiment, the conductor pattern division for the timing signal is arranged at the center of the overall pattern. FIG. 5b shows a case in which the conductor pattern division for timing signal is arranged at either end of the overall pattern, and the contact tips may be inclined as shown in line $44'$ due to external causes such as vibrations. In this case, the deviation of the contact tips due to such external may be increased. Actually, malfunctioning is prone if the angle $\theta$ of out-of-alignment line $44'$ exceeds $$l_4 = l_2 \tan \theta$$

where $l_2$ and $l_4$ are as shown in FIG. 5b. With the pattern of FIG. 4 where the division $1b$ for the timing signal is arranged at the center, the malfunctioning is reduced because $l_3$ which is given as $$l_3 = l_1 \tan \theta$$

is smaller than $l_4$ since $l_1$ is smaller than $l_2$.

While in the above embodiment the digital signal generator circuit has used D type flip-flops, similar effects may be obtained by using R-S flip-flops or J-K flip-flops. Also, entirely reverse operation can be obtained to obtain similar effects by making the common signal to be of level 1.

Further, while the above embodiment has concerned with the case of detecting the throttle aperture, this is by no means limitative, and the invention may also be applied to such cases as detecting the air flow or fuel meter level in the fuel injection control system and so forth.

Furthermore, while in the above embodiment the drum $1b$ is rotated for shifting the relative position between drum $1b$ and contact group $1a$ in slidable contact therewith, it is also possible to move the contact group $1a$. Moreover, the signal section which is constituted by the cylindrical drum $1b$ in the above embodiment need not be cylindrical but it may be planar. In the latter case, the relative movement will be linear.

As has been described in the foregoing, a first feature of the invention resides in the provision of a signal section consisting of a predetermined conductor pattern including a digital signal pattern and a timing signal pattern parallel therewith, a contact group consisting of digital signal contacts slidable over the digital signal pattern to take out a digital signal and a timing signal contact slidable over the timing signal pattern to take out a timing signal, and means to shift the relative position between the signal section and contact group according to a value of a detected parameter, whereby the relative position may be shifted in accordance with the value of the detected parameters, and a digital signal corresponding to the aforesaid relative position can be taken out. Also, since a digital signal generator circuit which provides the aforesaid digital signal when the timing signal is provided from the timing signal contact is provided, it is possible to prevent malfunctioning due to out-of-alignment of the tips of the contacts in the aforesaid contact group. Thus, it is possible to obtain an excellent effect of steadily producing accurate digital signals according to the detected value of the parameter with the combination of mechanical and electrical elements.

In addition to the above first feature of the invention, it is a second feature of the invention to arrange the timing signal pattern at the center of the overall conductor pattern, whereby it is possible to eliminate malfunctioning and generate accurate digital signals, increase allowable deviation of mechanical elements and simplify the adjustment thereof.

I claim:

1. A digital signal generator comprising a signal section having a predetermined conductor pattern including a plurality of digital signal patterns and a timing signal pattern parallel with said digital signal patterns and arranged between said plurality of digital signal patterns, said timing and said digital patterns each having a conductive portion and a non-conductive portion, the conductive portion of said timing pattern being substantially smaller than the conductive portion of said digital pattern, said conductive portion of said digital pattern having varying widths, the conductive portion of said timing pattern being positioned remote from a line extending transversely across said signal section at the junction of a conductive and non-conductive portion of said digital pattern, a contact group having digital signal contacts slidable over said digital signal pattern to derive a digital signal and a timing signal contact slidable over said timing signal pattern to derive a timing signal, means for shifting the relative position between said signal section and said contact group according to a variable parameter, and a digital signal generator circuit connected to said individual contacts of said contact group for selectively providing said digital signal when said timing signal is derived from said timing signal contact, wherein said digital signal generator circuit comprises a clockable bistable means having data terminals each connected to the associated data signal contacts respectively, a clock terminal connected to said timing signal contact, and an output terminal for continuing to provide the input signal at each of said data terminals from the instant when the input signal is applied to the clock terminal.

2. The digital signal generator according to claim 1, wherein said signal section has a cylindrical drum, and also wherein said shifting means has a rotative shaft secured to said cylindrical drum.

3. A digital signal generator comprising a signal section having a predetermined conductor pattern including a plurality of parallel digital signal patterns individually corresponding to respective parts of a digital signal to be generated and a timing signal pattern parallel with said digital patterns and corresponding to a timing signal, said timing signal pattern being arranged between said plurality of digital signal patterns, said timing and said digital patterns each having a conductive portion and a non-conductive portion, the conductive portion of said timing pattern being substantially smaller than the conductive portion of said digital pattern, said conductive portion of said digital pattern having varying widths, the conductive portion of said timing pattern being positioned remote from a line extending transversely across said signal section at the junction of a conductive and non-conductive portion of said digital pattern, a contact group having digital signal contacts slidable over said signal section and individually corresponding to said respective digital signal patterns and a timing signal contact slidable over said timing signal pattern, means for shifting the relative position between said signal section and said contact group according to the value of a detected parameter, and a digital signal generator circuit connected to said individual contacts of said contact group, wherein said digital signal generator circuit comprises a clockable bistable means having data terminals each connected to the associated data signal contacts respectively, a clock terminal connected to said timing signal contact, and an output terminal for continuing to provide the input signal at each of said data terminals from the instant when the input signal is applied to the clock terminal.

4. The digital signal generator according to claim 3, wherein said timing signal pattern is arranged at the center of said conductor pattern.

5. The digital signal generator according to claim 3, wherein said variable parameter is the extent of depression of an accelerator pedal coupled to said shifting means, said shifting means being controlled according to said extent of depression.

6. The digital signal generator of claim 3 wherein said timing signal pattern is positioned between a plurality of digital signal patterns and the digital signal patterns having the greatest conductive area being positioned furthest away from said timing signal pattern.

* * * * *